United States Patent
Kanamaru et al.

(10) Patent No.: US 6,566,149 B1
(45) Date of Patent: May 20, 2003

(54) METHOD FOR MANUFACTURING SUBSTRATE FOR INSPECTING SEMICONDUCTOR DEVICE

(75) Inventors: Masatoshi Kanamaru, Tsuchiura (JP); Atsushi Hosogane, Tsuchiura (JP); Yoshihige Endou, Tsuchiura (JP); Ryuji Kouno, Tsuchiura (JP); Hideo Miura, Tsuchiura (JP); Shinji Tanaka, Tsuchiura (JP); Hiroyuki Ohta, Tsuchiura (JP); Akihiko Ariga, Kodaira (JP); Naoto Ban, Tsuchiura (JP); Hideyuki Aoki, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/787,250

(22) PCT Filed: Sep. 16, 1998

(86) PCT No.: PCT/JP98/04158
§ 371 (c)(1),
(2), (4) Date: Mar. 16, 2001

(87) PCT Pub. No.: WO00/16107
PCT Pub. Date: Mar. 23, 2000

(51) Int. Cl.[7] ............................ G01R 31/26; H01L 21/66
(52) U.S. Cl. ............................ 438/14; 438/17; 438/18; 438/613; 438/618; 438/455; 257/48; 324/500
(58) Field of Search ........................ 438/14, 455, 613, 438/107, 17–18, 618; 324/500; 257/48

(56) References Cited

U.S. PATENT DOCUMENTS

| | | | | |
|---|---|---|---|---|
| 4,965,865 A | * | 10/1990 | Trenary ........................ 324/158 |
| 5,419,807 A | * | 5/1995 | Akram et al. ................ 156/647 |
| 5,491,427 A | * | 2/1996 | Ueno et al. .................. 324/754 |
| 5,834,945 A | * | 11/1998 | Akram et al. ................ 324/755 |
| 5,854,558 A | * | 12/1998 | Motooka et al. ............. 324/754 |
| 5,869,974 A | * | 2/1999 | Akram et al. ................ 324/754 |
| 5,880,010 A | * | 3/1999 | Davidson ..................... 438/455 |
| 5,894,161 A | * | 4/1999 | Akram et al. ................ 257/48 |
| 5,931,685 A | * | 8/1999 | Hembree et al. ............. 439/74 |
| 5,936,845 A | * | 8/1999 | Soejima et al. ............. 361/767 |
| 5,952,840 A | * | 9/1999 | Farnworth et al. ......... 324/755 |
| 5,982,132 A | * | 11/1999 | Colby ......................... 318/649 |
| 6,072,190 A | * | 6/2000 | Watanabe et al. ............ 257/48 |
| 6,130,148 A | * | 10/2000 | Farnworth et al. .......... 438/613 |
| 6,261,854 B1 | * | 7/2001 | Akram et al. ................ 438/17 |
| 6,362,637 B2 | * | 3/2002 | Farnworth et al. .......... 324/755 |
| 6,437,423 B1 | * | 8/2002 | Akram ........................ 257/624 |

FOREIGN PATENT DOCUMENTS

| | | | |
|---|---|---|---|
| JP | 61-42482 | 3/1986 | |
| JP | 63-220533 | * 9/1988 | ........... H01L/21/60 |
| JP | 2-161739 | * 6/1990 | ........... H01L/21/60 |
| JP | 4-56244 | 2/1992 | |
| JP | 8-50146 | 2/1996 | |
| JP | 9-54116 | 2/1997 | |
| JP | 10-190005 | 7/1998 | |

* cited by examiner

*Primary Examiner*—Matthew Smith
*Assistant Examiner*—Granvill D Lee, Jr.
(74) *Attorney, Agent, or Firm*—Antonelli, Terry, Stout & Kraus, LLP

(57) ABSTRACT

For an inspection tray, a silicon substrate including a beam or a diaphragm, a probe and wiring is used. To highly accurately position a chip to be inspected, a second substrate for alignment is disposed on the substrate. To position the probe having wiring disposed on the first substrate and the electrode pad of the chip to be inspected, a projection or a groove is formed in each of both substrates. Preferably, the projection or groove should be formed by silicon anisotorpic etching to have a (111) crystal surface. As another machining method, dry etching can be used for machining the positioning projection or groove. By using an inductively coupled plasma-reactive ion etching (ICP-RIE) device for the dry etching, a vertical column or groove can be easily machined.

14 Claims, 9 Drawing Sheets

METHOD FOR MANUFACTURING SUBSTRATE FOR INSPECTING SEMICONDUCTOR DEVICE

TECHNICAL FIELD

The present invention relates to a testing device for a semiconductor element or a semiconductor device. More particularly, the invention relates to a method for manufacturing a substrate used to inspect the semiconductor element, which substrate constitutes the inspecting device, in order to realize a semiconductor element inspecting device capable of performing efficient inspection for the electric characteristic of the semiconductor element in a semiconductor manufacturing process, such as wafer probing inspection, burn-in inspection carried out in a wafer state or the like.

BACKGROUND ART

The process of manufacturing a semiconductor device, such as an IC, an LSI or the like, is largely divided into two stages: a pre-process including steps up to the formation of an integrated circuit on the surface of a silicon wafer; and a post-process including steps up to the separation of the silicon wafer into individual chips and the sealing of these chips with resins, ceramic or the like.

In a given stage during the pre-process, inspection is carried out for the electric characteristic of each circuit in such semiconductor device to determine if there are any defective chips by a chip unit.

With regard to the electric characteristic inspection, there are generally two available methods. One is probing inspection designed to determine whether or not a good conduction state has been established between circuits. The other is burn-in inspection designed to identify a defect in an accelerated manner by applying thermal or electrical stress on the circuit at a high temperature of about 150° C.

Both of the probing inspection and the burn-in inspection employ basically similar means for connecting the wafer to be inspected with an external inspection system, and a method for mechanically pressing individual conductive microprobes to respective electrode pads made of aluminum alloy or other alloys, patterned at a pitche set in the range of several tens to a hundred and several tens $\mu$m on the wafer to be inspected, and having a square set in the range of several tens to a hundred and several tens $\mu$m and a thickness of about 1 $\mu$m.

Conventionally, there has been disclosed a method for inspecting a bare chip by using an inspection tray in JP-A-04-56244. According to the method disclosed therein, a projected electrode (bump) is formed on the electrode pad of the bare chip by plating or the like, and the bare chip is aligned with a burn-in substrate having special solder pasted thereon, and then mounted on the substrate by means of reflowing. The substrate including the bare chip is then set in a burn-in furnace, and burn-in inspection is carried out to determine whether or not the bare chip is defective.

The foregoing inspection tray method includes the steps of, for carrying out inspection: forming a projected electrode on the electrode pad of each bare chip; aligning the bare chip with the substrate and then fixing the chip by means of reflowing; and removing the bare chip from the substrate after the burn-in inspection. These steps greatly complicate the entire process, resulting in the problem of a long time expended to complete the inspection. This problem inevitably brought about an increase in manufacturing costs. In addition, it is necessary to arrange and then align individual bare chips on and with the substrate. However, the alignment of the chips at pitches of several tens $\mu$m is difficult and, therefore, such a bare chip inspection method is not suitable for inspecting the semiconductor element, higher integration being expected therefor in the future.

The present invention is made with the foregoing problems in mind, which have been inherent in the electric characteristic inspection of the semiconductor element. It is an object of the invention to provide an inexpensive and highly reliable semiconductor device capable of simultaneously inspecting all the electrode pads of, for example several tens of chips to be inspected en block, thereby improving manufacturing yield and reducing manufacturing costs.

DISCLOSURE OF THE INVENTION

In order to achieve the foregoing object, a first silicon substrate forming a beam or a diaphragm, a probe and wiring is used for an inspection tray. To highly accurately position a chip to be inspected, a second substrate for alignment is disposed on the first substrate. To position the probe having the wiring disposed on the first substrate and the electrode pad of the chip to be inspected, a projection or groove is formed in each of the substrates. More specifically, the projection or groove should be preferably formed by silicon anisotropic etching to have a (111) crystal surface. As another machining method, dry etching can be used for machining the positioning projection or groove. By using an inductively coupled plasma-reactive ion etching (ICP-RIE) device for the dry etching, a vertical column or groove can be easily machined.

The two substrates may be formed by juncture. In this case, silicon materials having equal thermal expansion coefficients are most suitable. However, the invention permits the use of other materials having thermal expansion coefficients substantially equal to that of silicon, e.g., a glass substrate developed for a micro-machine, having a thermal expansion coefficient substantially equal to that of the silicon, and enabling anodic bonding, or other resin materials. The invention also permits the use of a shape memory alloy partially joined to the first substrate.

The use of the foregoing structure enables accurate and quick inspection to be carried out. As a result, it is possible to inexpensively provide a semiconductor element or electronic components.

BEST MODE FOR CARRYING OUT THE INVENTION

Next, description will be made of the preferred embodiments according to the present invention with reference to the attached drawings, i.e., FIGS. 1 to 15.

Figure 1:
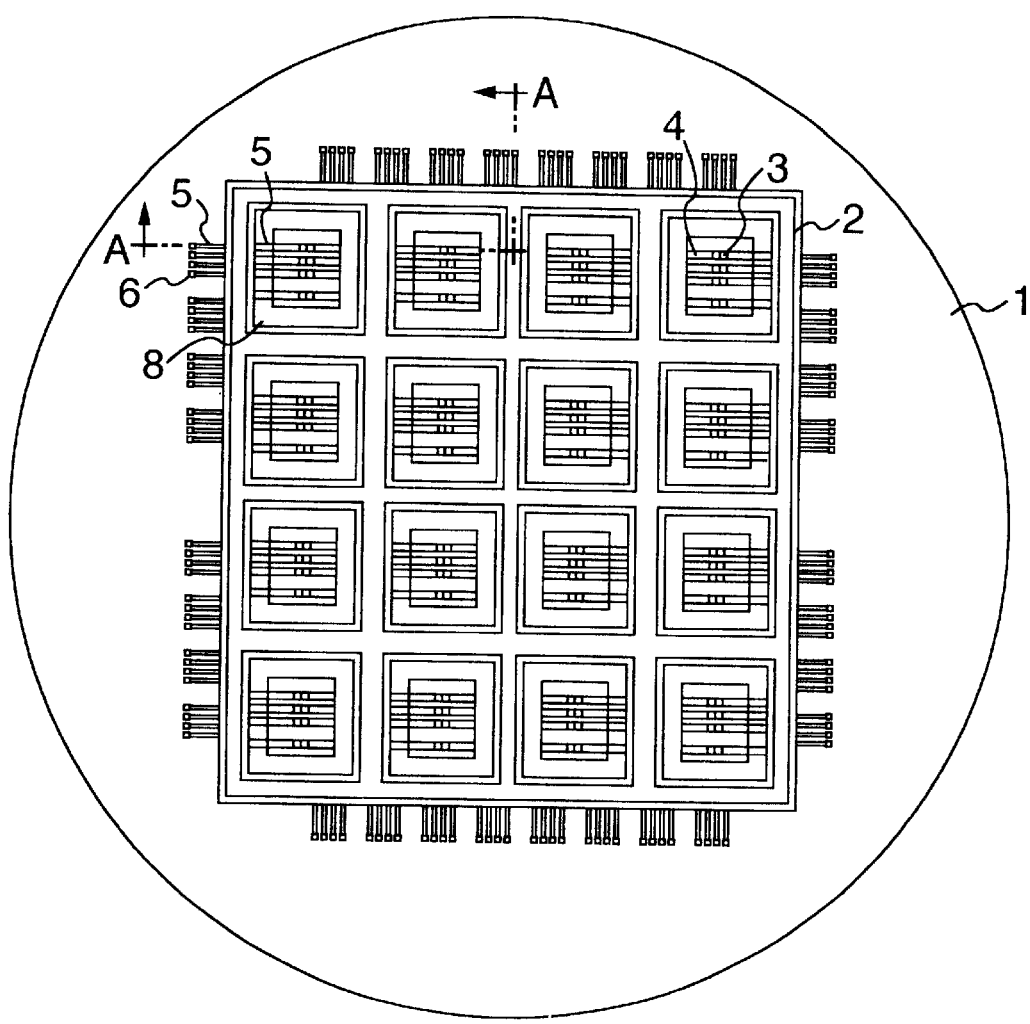
FIG. 1 is a plan view of an embodiment according to the present invention.
Figure 2:
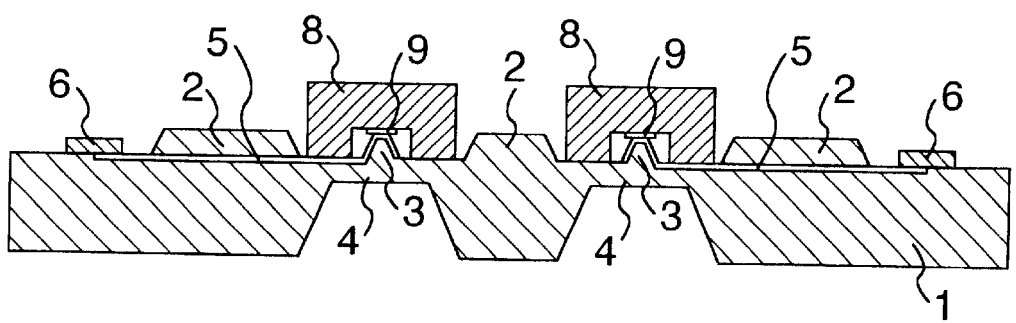
FIG. 2 is a sectional view of the embodiment in FIG. 1.

First, the structure of an inspection tray according to an embodiment of the invention is described by referring to the plan and sectional views respectively of FIGS. 1 and 2. FIG. 2 is a sectional view taken on line A—A of FIG. 1.

As shown in FIG. 2, the structure of the inspection tray according to the invention includes beams 4 formed on a silicon substrate 1, which beams are easily deformed individually. Each of the beams 4 has a probe 3 formed to conduct electricity with a chip to be inspected. For the structure of the beam 4, one may be selected for use from a cantilever beam and a fixed support beam. One of the beams may also be used for the structure of a diaphragm, since the body to be inspected is cut out in a chip form and warping or bending is small.

The probe 3 has a metallic wiring 5 formed thereon. This wiring 5 is extended to an electrode pad 6 to enable electric communication to be made with an external unit. In the embodiment, the electrode pad 6 is provided on the same plane as that of the probe 3. However, the electrode pad 6 may be provided on a surface opposite to the probe 3 via through-wiring in which the wiring is interconnected by a through-hole.

A projection 2 formed in the silicon substrate 1 is provided to position the chip to be inspected. The chip 8 to be inspected is highly accurately positioned by the projection 2, enabling accurate contact to be realized between a plurality of electrode pads 9 of the chip 8 to be inspected and the probes 3 of the silicon substrate 1. The projection 2 is formed to have a height equal to that of the probe 3. Such a height is set depending on the patterning accuracy of the probe 3, which will be described in detail later.

As described above, to enable simultaneous electric inspection to be carried out for the plurality of chips 8 to be inspected, the inspection tray according to the invention includes the silicon substrate integrally composed of the beams 4, the probes 3 and the wiring 5.

In FIG. 1, the plurality of chips 8 to be inspected, arranged on the silicon substrate 1, are indicated by dotted lines in such a way as to clearly show positional relations between the beams 4 and the probes 3. The probes 3 are highly accurately machined by a micro-machining technology in matching them with the positions of the plurality of electrode pads 9 of the chips 8 to be inspected. The position accuracy thereof is set so as to be equal to ±1 μm or lower. The wiring 5 on the probe 3 is connected to the electrode pad 6 disposed around the same.

Figure 3:
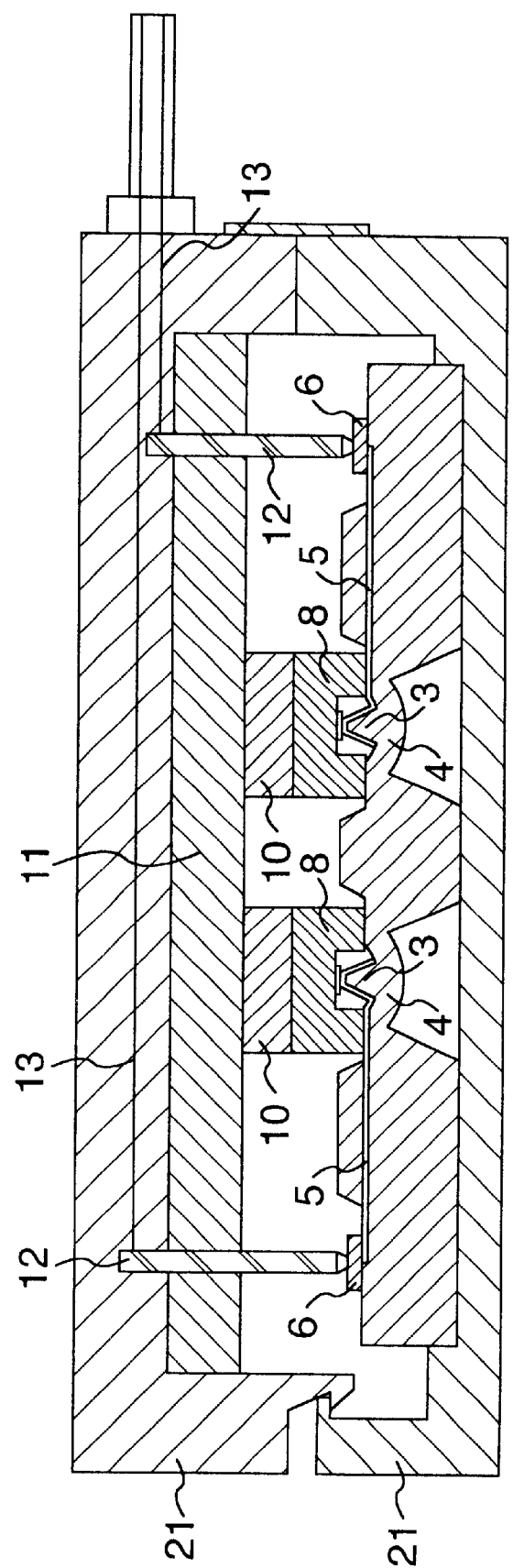
FIG. 3 is a view showing a burn-in inspection pack with respect to the embodiment of the invention.

Now, description will be made of burn-in inspection carried out by using the inspection tray constructed in the foregoing manner with reference to FIGS. 3 and 4. FIG. 3 is a sectional view showing a burn-in inspection pack 21 including a plurality of inspection chips mounted on the inspection tray according to the invention.

Good electric contact is realized between the probe 3 and the chip 8 to be inspected by a reaction force generated by the deformation of the beam 4 when the probe 3 is brought into contact with the electrode pad 9 of the chip 8 to be inspected as shown in the drawing. On the upper side of the chip 8 to be inspected, a absorbing material 10 and a pressing plate 11 are disposed, and secured by the burn-in inspection pack 21. The absorbing material 10 is provided to absorb variance in height among the chips 8 to be inspected. Electric conduction of the probe 3 with the external unit is carried out through the wiring 5 provided on the substrate 1, by pressing the electrode pad 6 arranged on the substrate 1 with a pogopin (spring probe) 12 to conduct electricity, and through an internal wiring 13 connected to the pogopin 12. The internal wiring 13 is connected to a tester device installed outside for transfering an electric signal with the tester divice.

Figure 4:
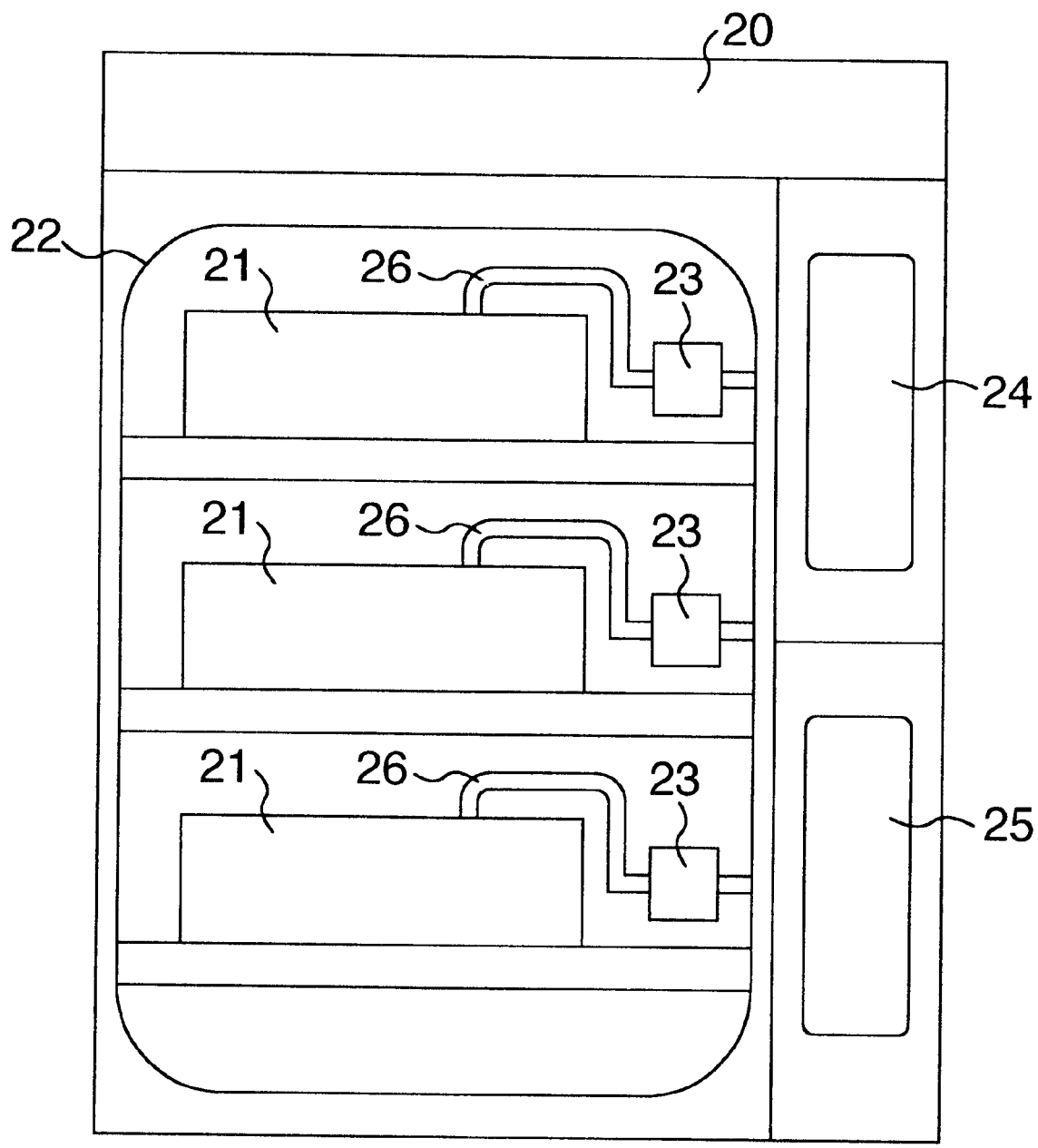
FIG. 4 is a view showing a burn-in inspection system.

Now, the peripheral devices of the burn-in inspection pack according to the invention are described by referring to FIG. 4.

A reference numeral 20 denotes a burn-in inspection device; 22 a thermostatic chamber including a plurality of burn-in inspection packs 21 disposed therein. The temperature in the thermostatic chamber is controlled by a temperature controller 25. Multiple wirings 26, amounting to approximately 2000 in number, are connected to each burn-in inspection pack 21, and also connected through a high-speed switching circuit 23 to a tester circuit 24. The high-speed switching circuit 23 is provided to reduce the number of wirings by using a switching circuit to switch connections among the multiple wirings 26. In the embodiment, the high-speed switching circuit is made of silicon. Accordingly, the high-speed switching circuit 23 can be incorporated in the silicon substrate 1 inside the burn-in inspection pack 21, realizing a structure having a greatly reduced number of wirings from the burn-in inspection pack 21.

In the burn-in inspection device, long-time electric inspection is carried out at a high temperature of about 150° C. Accordingly, the use of a silicon substrate similar to the waver to be inspected can prevent problems including probe position shifting caused by thermal expansion, and so on.

FIGS. 5A to 5E are sectional views, each showing a machining process using a micro-machining technology for the foregoing substrate made of silicon.

Figure 5A:
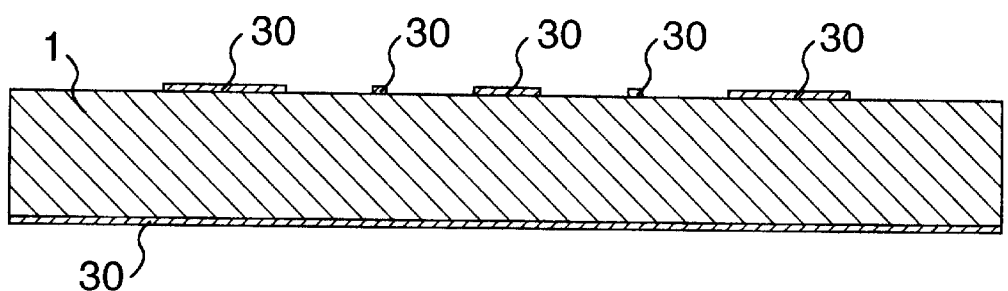
FIG. 5 is a view showing a machining process of an inspection tray with respect to the embodiment of the invention.

First, a thermal silicon oxide film is deposited to have a thickness of 0.5 μm by using a silicon wafer of 500 μm (100) thickness orientation. As shown in FIG. 5A, by using a photolithography process, resist coating, pattern exposure, development and thermal oxide film etching are carried out from one side on the thermal silicon oxide film deposited on the surface of the silicon wafer 1, and then a mask pattern is formed by a thermal silicon oxide film 30 in order to form a probe and a positioning projection. Subsequently, by using potassium hydroxide aqueous solution of 60° C., the silicon is subjected to the anisotropic etching of 20 μm difference in level.

Figure 5B:
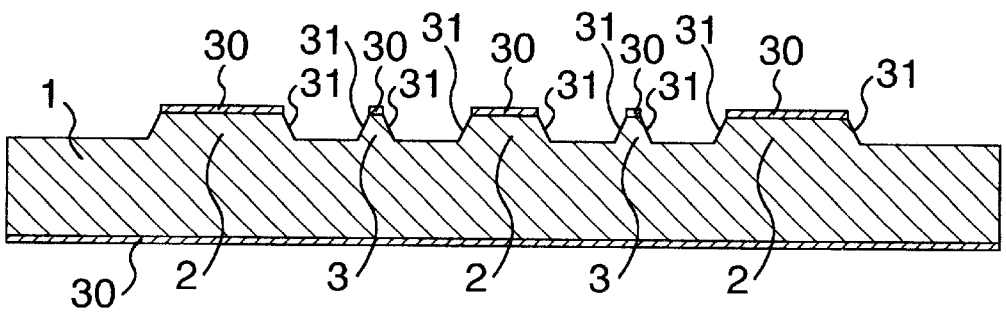

The foregoing etching results in the formation of a probe 3 and a positioning projection 2 as shown in FIG. 5B. A reference numeral 31 denotes a (111) surface and, as compared with other crystal surfaces, an etching speed thereof is very slow. Thus, as shown in FIG. 5B, an etching section is formed to be inclined. The solution used for the silicon etching machining is not limited to the potassium hydroxide aqueous solution, and other wet etching liquid can be used, such as ethylenediamine pyrocatechol, tetramethyl ammonium hydroxide, or hydrazine. In addition, after this step, by using a machining process similar to that of the foregoing, beams for separating probes from one another may be formed by etching beforehand.

As noted above, the probe 3 is formed to have a height equal to that of the projection 2 for positioning the chip to be inspected. This is because of the simultaneous machining of these components, as the position and tip shape of each probe 3 must be machined highly accurately. Regarding the patterning of a mask after resist coating, if an exposure system having a ratio of mask patterns and transfer patterns set at 1:1 is used, an exposure gap should preferably be reduced as much as possible. This is because if present, the exposure gap interferes with the good patterning of a probe tip shape after etching. In the case of the machining process of forming the positioning projection 2 first, and then patterning the probe 3, the plurality of probes 3 must inevitably be patterned while there is a difference in level, inhibiting the highly accurate machining of a probe tip shape.

In the case of forming the probe 3 to be higher than the positioning projection 2, a mask can be transferred highly accurately by using a stepper or the like. In the case of forming a probe tip shape by using silicon anisotropic etching, an etching mask to be used must have a mask shape, which enables a target shape to be obtained at a point of time when a proper depth of etching is reached.

Figure 5C:
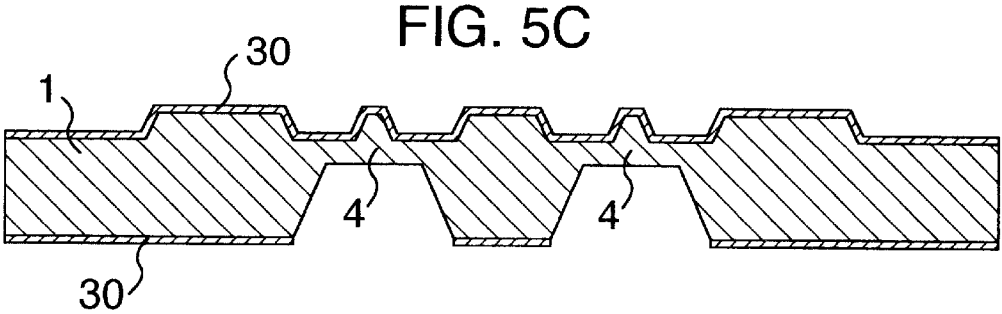

Further, by using a photolithography process, resist coating, pattern exposure, development, thermal silicon oxide film etching, and silicon anisotropic etching are carried out from the backside as shown in FIG. 5C to form a beam or a diaphragm 4. In this case, by adjusting the amount of etching, the thickness of the beam or diaphragm left at the end can be controlled freely.

Figure 5D:
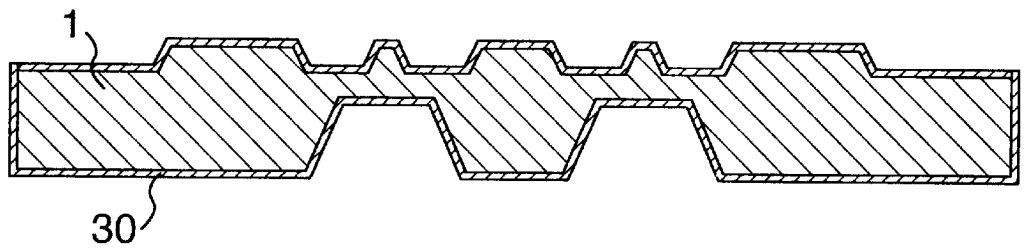
Figure 5E:
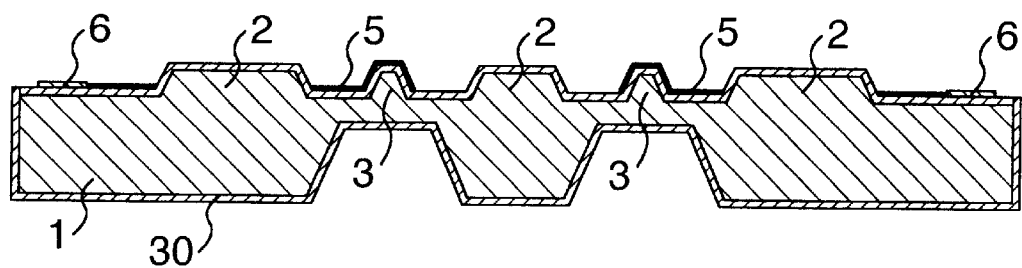

Subsequently, as shown in FIG. 5D, a thermal silicon oxide film is deposited to have a thickness of about 1 $\mu$m on all surfaces. Then, a sputtering device is used to deposit Cr thin layer of 20 nm and to deposit Ni thin layer of 300 nm thereon, and then, thick-film resist and a lift-off method are used to form wiring 5, as shown in FIG. 5E. The wiring between the wiring part of the tip of the probe 3 and the electrode pad 6 is not shown in the sectional view, as the wiring is located behind the positioning projection 2. In practice, a wiring groove is formed in the positioning projection 2, and such the wiring is formed in the groove. The wiring groove is formed at the time when the positioning projection 2 is formed. In other words, a groove-shaped patterning is formed in the mask pattern of the positioning projection, and the wiring groove is formed by etching.

According to the other embodiment, the formation of the positioning projection 2 outside the electrode pad 6 can eliminate the necessity of providing any wiring grooves. For the wiring, one may be selected from any materials, which have a melting point of 150° C. or higher, and can form an electrically conductive thin film.

A device to be used for the wiring is not limited to the sputtering device, and other devices such as a deposition device or a chemical vapor deposition (CVD) device can be used. Further, the method for forming wiring is not limited to the lift-off method. After the formation of a thin film on all surfaces of the substrate, a photolithographic operation and etching may be carried out to form wiring. According to the invention, the etching machining of the probe forming substrate is not limited to the anisotropic etching. Instead, etching machining can be carried out by a combination of dry etching devices such a reactive ion etching (RIE) device, an ion milling device, and so on.

Figure 6:
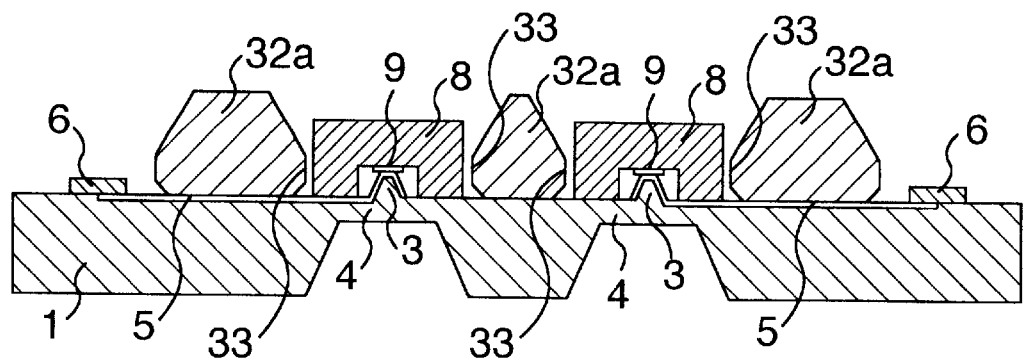
FIG. 6 is a sectional view of the other embodiment according to the invention.

FIG. 6 shows the other embodiment according to the invention.

In the foregoing embodiment, the positioning projection 2 was formed by using the substrate 1. According to the embodiment described herein, however, there is provided a structure where a beam or a diaphragm 4, a probe 3 and a metallic wring 5 are formed on a silicon substrate 1, and a positioning substrate 32a is disposed thereon as a second substrate. In other words, a positioning substrate is prepared by using a member different from that for the substrate 1 (but material quality and so on are similar), and then joined to the substrate 1. This structure enables the positioning substrate 32a to be set high, thereby facilitating the positioning of the chip 8 to be inspected.

The height or thickness of the positioning substrate 32a should preferably be set equal to or larger than the thickness of the chip 8 to be inspected. Thus, the formation thereof thicker than the chip 8 to be inspected assures the execution of positioning even when there is variance in thickness among chips 8 to be inspected.

The positioning substrate 32a is highly accurately positioned by joining it to the silicon substrate 1. The positioning substrate 32a is machined by using the micro-machining technology, and formed by executing anisotropic etching from both sides. Such silicon anisotropic etching from both sides enables a vertical surface 33 most suitable for positioning to be formed.

Next, description will be made of a highly accurate positioning method for the silicon substrate 1 and the positioning substrate 32a. Each of FIGS. 7A to 7C illustrates in detail the method of positioning a silicon crystal surface carried out by using silicon anisotropic etching.

Figure 7A:
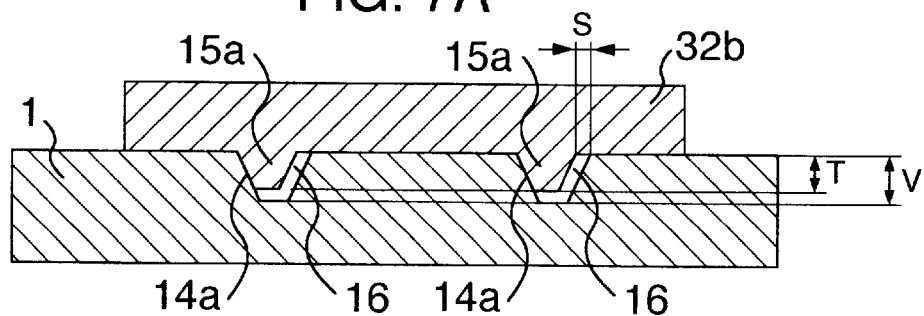
FIGS. 7, 8 and 9 are sectional views, each showing a positioning mechanism of the other embodiment of the invention.
Figure 7B:
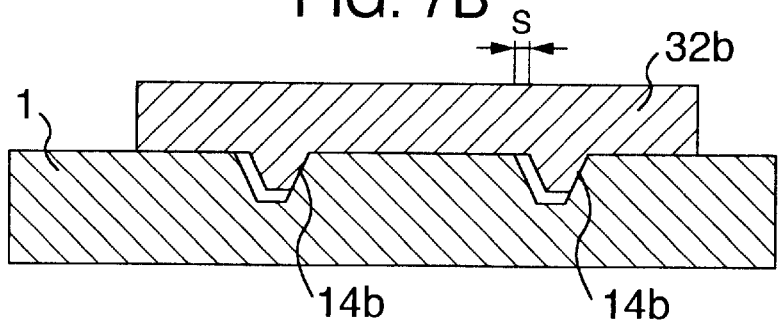

As shown in FIG. 7A, a groove 16 is formed to have a depth V on the substrate 1 by means of silicon anisotropic etching. On the other hand, a projection 15a is formed to have a height T on the positioning substrate 32a similarly by means of silicon anisotropic etching. The groove depth V is machined to be larger than the projection height T by etching. Slopes provided in both substrates are formed to be (111) surfaces, and at identical angles of 54.7°. Accordingly, when both substrates are laminated, the slopes thereof are tightly contacted to each other. In FIG. 7A, such tight contact is represented by the slope 14a of the left side, while in FIG. 7B, it is represented by the slope 14b of the right side. Thus, whichever direction, left or right, shifting may occur, its positioning accuracy becomes S. In other words, positioning accuracy can be decided depending on the machining dimension of the groove or the projection formed in either one of the substrates.

Figure 7C:
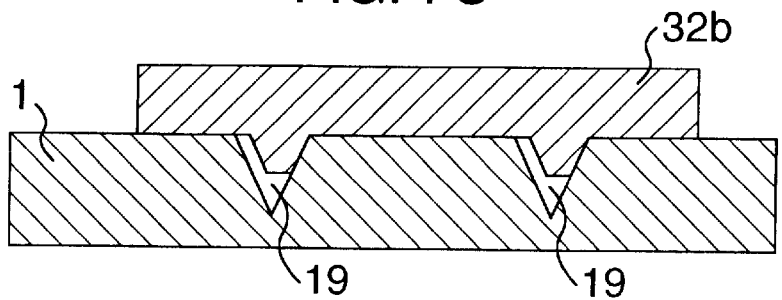

As shown in FIG. 7C, the groove may be formed to have a V-groove structure. When machining is carried out by using silicon anisotropic etching, etching suddenly slows down at a point of time when a V groove 19 is formed. If employed, the above structure can improve machining accuracy more as compared with the bottomed groove in FIG. 7A. Moreover, instead of using wet etching such as silicon anisotropic etching or the like, a groove and a projection may be formed by using dry etching.

Figure 8:
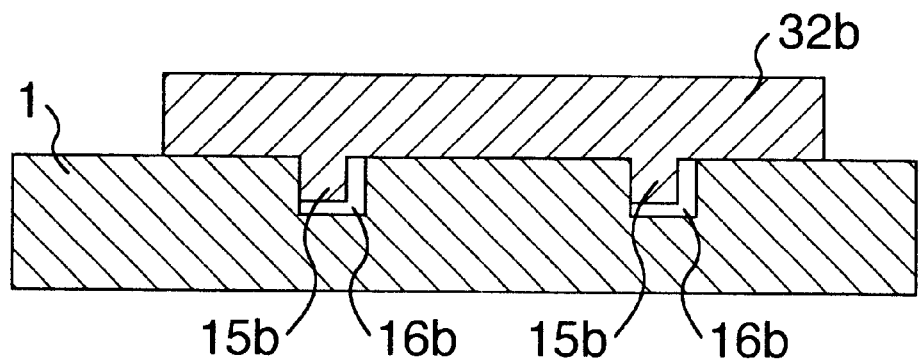

FIG. 8 shows in section a groove and a projection formed by using dry etching.

A groove 16b having a vertical section is formed in the silicon substrate 1, while a projection 15 also having a vertical section is formed on the positioning substrate 32b. This structure enables positioning to be executed with accuracy higher than that in the case of crystal surface positioning method. In addition, since machining is carried out by means of dry etching, the degree of shaping freedom, e.g., a columnar or prismatic structure, can be increased more as compared with the case of wet etching.

The positioning groove and the projection of the substrates may be positioned in the outer peripheral surfaces of the substrates other than therein. Further, the groove and the projection used for positioning may be formed in any of the substrates.

Warping or twisting may occur more easily as the silicon substrate used to form a structure such as a beam, a probe or the like is larger. Thus, if the overlapping height between the positioning projection and the groove formed in the silicon substrate and the positioning substrate is small, then there is a possibility that the positions of both substrates will be shifted by the movements thereof.

Figure 9:
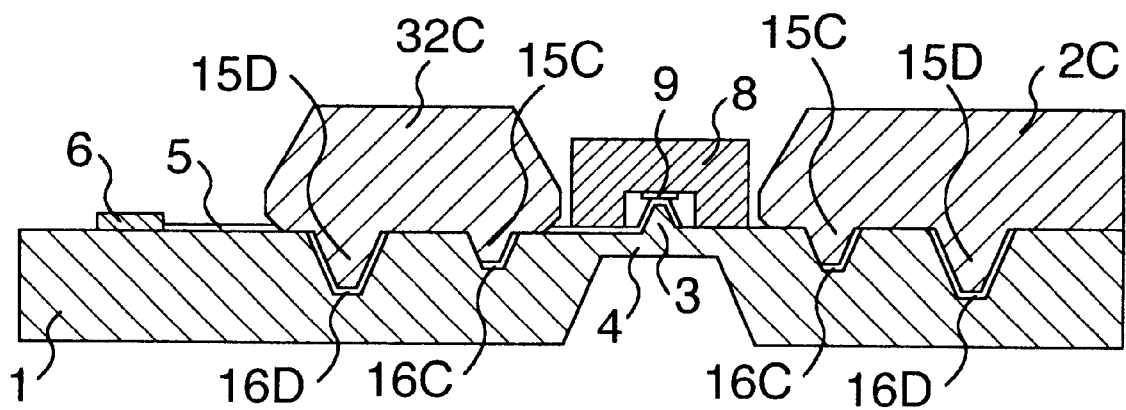

Next, description will be made of a structure free from position shifting even when warping or twisting may occur. FIG. 9 illustrates a structure, which enables highly accurate positioning to be carried out for both substrates even when warping or twisting is present in the silicon substrate.

According to the embodiment, a high projection 15d and a low projection 15c are respectively formed on a positioning substrate 32c. On the other hand, on the silicon substrate 1, a deep groove 16d and a shallow groove 16c are formed to match the respective projections formed on the positioning substrate. A depth of each groove is formed to be larger than the height of each projection.

Specifically, the projection 15c and the groove 16c are provided with high dimensional accuracy to align both substrates with high accuracy. On the other hand, the projection 15d and the groove 16d are provided to suppress shifting caused by warping or twisting at the time of laminating both substrates, and high dimensional accuracy is not required. The structure thus constructed facilitates the handling of the two substrates, and can prevent the shifting of the substrates caused by warping to twisting.

Figure 10A:
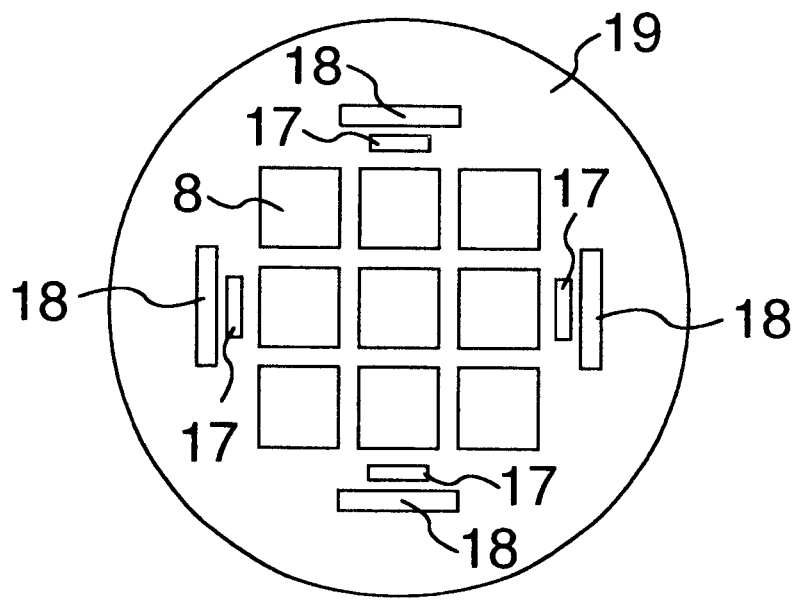
FIG. 10 is a plan view showing the positioning mechanism of the other embodiment of the invention.
Figure 10B:
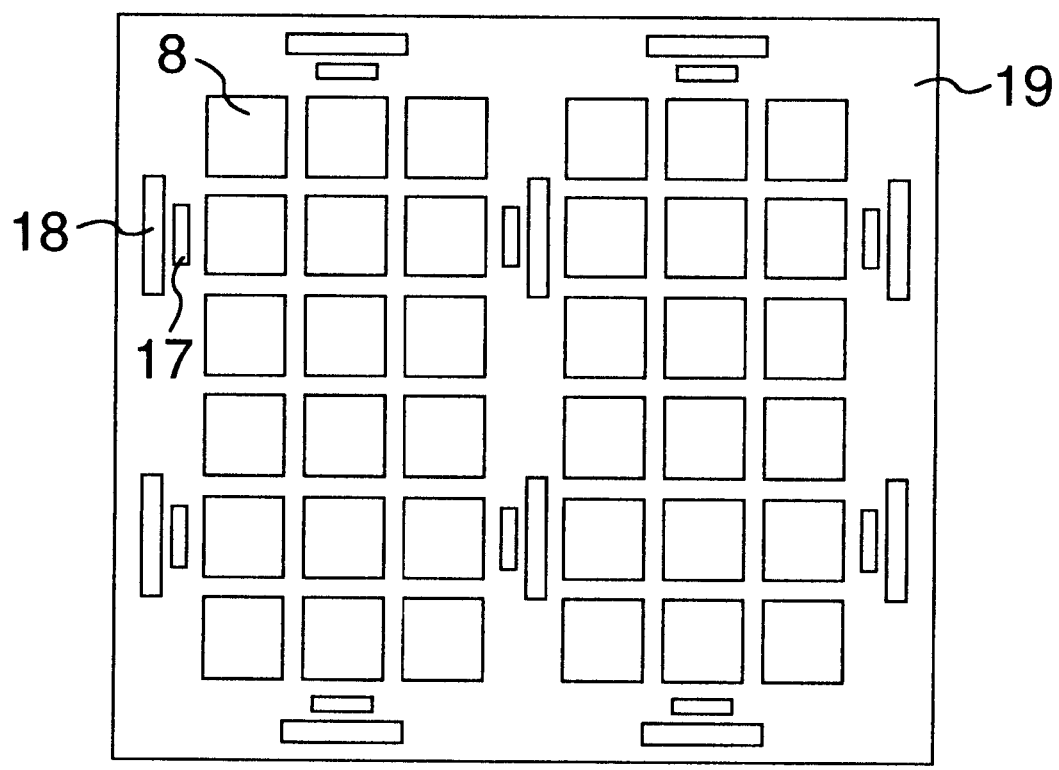

FIGS. 10A and 10B are plan views, each showing an inspection tray constructed by combining the silicon substrate and the positioning substrate.

FIG. 10A specifically shows an inspection tray 19 formed on a silicon wafer, nine chips 8 to be inspected are disposed. Though not shown, a plurality of probes formed in the inspection tray 19 and the electrode pads of the chips 8 to be inspected are highly accurately positioned by highly accurately machined grooves and projections 17. The warping or the like of the substrate is suppressed by a groove and a projection 18 formed in the periphery thereof. The shape of the inspection tray according to the invention may not be circular different from the case of the silicon wafer.

As shown in FIG. 10B, the structure formed like that shown in FIG. 10A is cut out by dicing or the like, and the cut pieces are collected in another tray 7, thereby forming a tray to be used for inspecting a large number of chips 8 to be inspected. In this case, the occurrence of warping or twisting present on the substrate are suppressed by the deep groove and the projection 18. Hence, assembling on the tray substrate 7 can be facilitated, and several tens of chips to be inspected are highly accurately positioned by the highly accurately machined groove and the projection 17.

A junction technology may be used for the alignment and the joining of the silicon substrate and the positioning substrate. In this case, the temperature of the junction technology should preferably be set equal to/lower than one where the metallic wiring is not deformed or melted at a temperature of 150° or more in the burn-in inspection.

Figure 11:
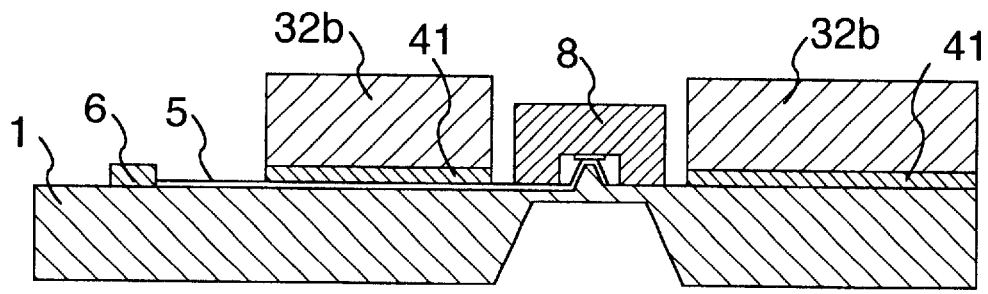
FIGS. 11, 12 and 13 are views, each showing a substrate to be positioned with respect to the other embodiment of the invention.

FIG. 11 shows in section the example of fixing by means of juncture.

The positioning substrate 32b and the substrate 1 both made of silicon are secured to each other by an insert material 41. For the insert material 41, one may be selected from gold-silicon, gold-tin, lead-tin and other alloys. Other than this, a juncture method such as surface activation junction or the like may be employed, which executes joining after the activation of the surface by high-temperature adhesive, or atom/ion beams in vacuum. The area of juncture should preferably cover the full surface of the positioning substrate. However, with only partial juncture, the functionality of the invention is not lost.

With regard to a material for the positioning substrate, any other than silicon may be used as long as it brings about alignment enabling good contact to be made between the electrode pad of the chip to be inspected and the probe of the inspection tray. In other words, a material having a thermal expansion coefficient substantially equal to that of the material for the other substrate is preferred.

Figure 12:
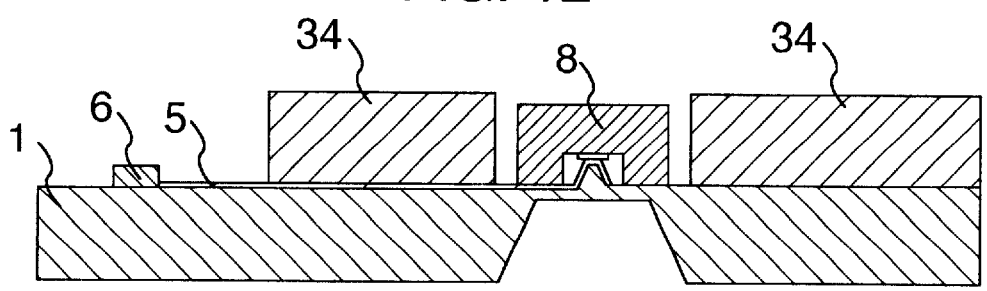

FIG. 12 shows the embodiment of using a glass substrate as a material other than silicon for the positioning substrate. A glass substrate 34 is used for the positioning substrate, and can be fixed by anodic bonding, thereby enabling highly accurate juncture to be carried out. For the glass substrate 34, one having a thermal expansion coefficient substantially equal to that of silicon, developed for a micro-machine, can be used. Other than this, a resin material may be used.

Figure 13A:
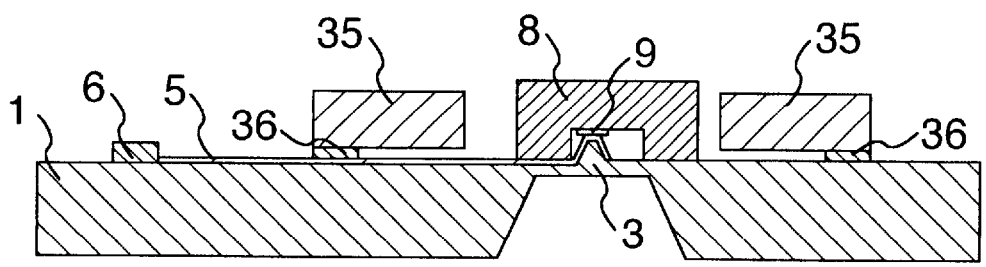
Figure 13B:
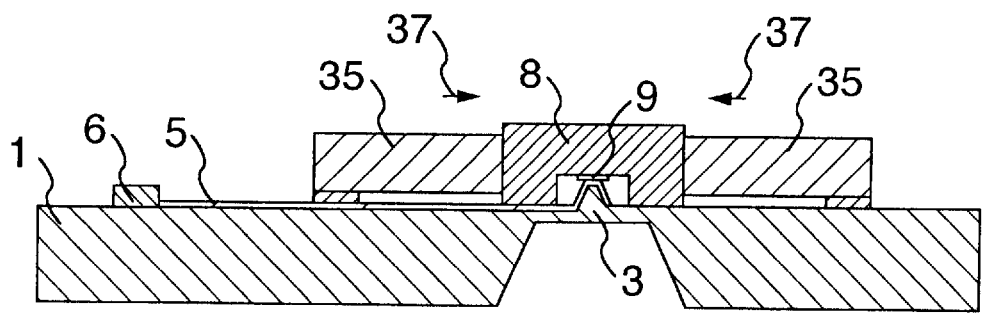

FIGS. 13A and 13B show the embodiment of using a shape memory alloy as a material other than silicon for the positioning substrate.

A shape memory alloy is used for a positioning substrate 35 and, as shown in FIG. 13A, the silicon substrate 1 and a part of the positioning substrate 25 are secured to each other by a joining layer 36. In this case, the position of the electrode pad 9 of the chip 8 to be inspected is greatly different from the position of the probe 3. By increasing a temperature thereof to an inspection temperature for burn-in inspection or the like, as shown in FIG. 13B, the positioning substrate 35 made of the shape memory alloy is extended in an arrow direction 37 to a preset gap, thereby automatically aligning the electrode pad 9 of the chip 8 to be inspected with the probe 3.

According to the embodiment, since there can e a large gap between the substrates for positioning, the chip to be inspected can be easily disposed in the inspection tray. As a result, it is possible to shorten work time, and reduce costs.

The electrode pad of the silicon substrate for the electric communications of the inspection tray with the external unit may be formed on a side opposite to the probe forming surface other than the probe side.

Figure 14A:
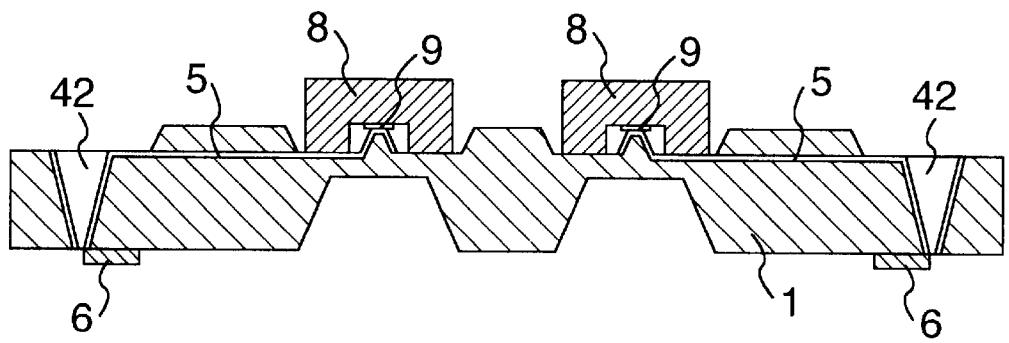
FIG. 14 is a sectional view showing through-wiring in which the wiring is interconnected by a through-hole of the embodiment of the invention.
Figure 14B:
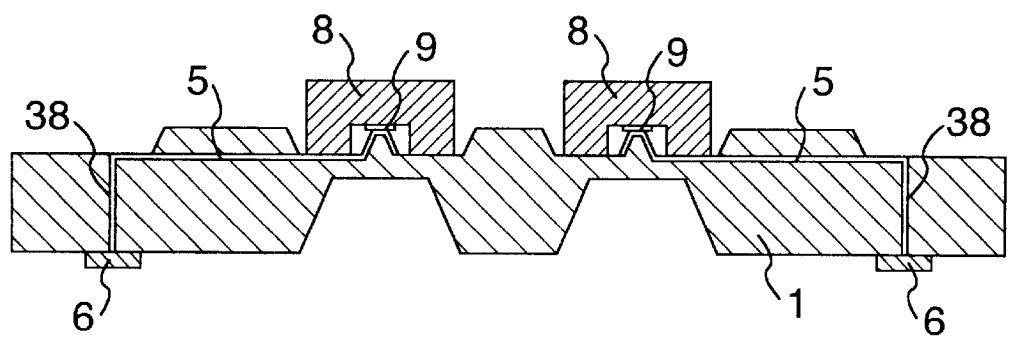

Now, various methods of the through-wiring using the silicon substrate according to the invention are described by referring to FIGS. 14A and 14B.

FIG. 14A shows a through-hole 42 formed from the upper side of the silicon substrate 1 by anisotropic etching. After the formation of the through-hole 42, a thermal oxide film consisting of silicon dioxide is deposited, and wiring 5 is formed thereon. An etching surface is formed by a (111) surface and, preferably, a metallic wiring should be formed on the full etching surface. This is due to the fact that though a wiring pattern can be formed on the slope if tried, it is technically difficult because of a small pad dimension.

Instead of being formed from one side by etching, the through-hole 42 may be formed from both sides of the silicon substrate 1 by anisotropic etching. The use of the etching method from both sides enables an opening to be formed smaller compared with that in the case of etching from one side. Accordingly, it is possible to increase the number of pads to be taken out from a given space.

A slope is formed in the through-hole 42 thus formed by using anisotropic etching. Thus, a good wiring is formed even when a sputtering device, a deposition device or a plating device is used. Further, as means for increasing the number of pads to be taken out from a given space, as shown in FIG. 14B, a method for forming a vertical through-hole 38 in silicon substrate 1 by using an ICP-RIE device can be used.

For wiring, a method is employed, which executes electroplating by using the plating device after forming thermal silicon oxide film on all surfaces and forming a metallic thin film on one side, and buries the through-hole with metal. This is because even when a thin film is formed, by using the sputtering device or the deposition device, in the vertical through-hole 38 formed in the silicon substrate 1, no thin films are formed on the side wall of the vertical surface.

Figure 15:
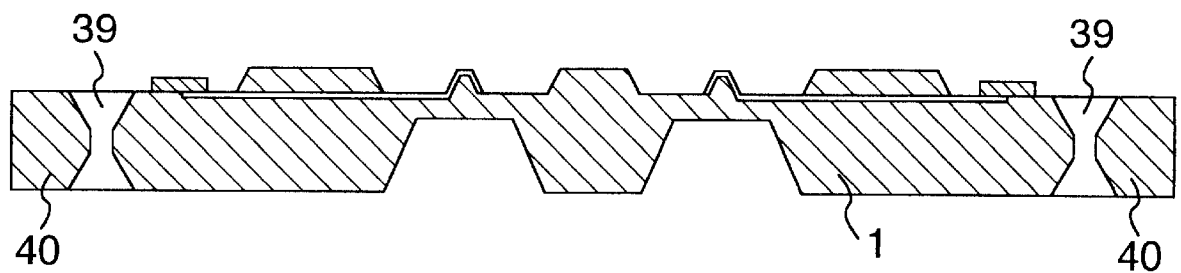
FIG. 15 is a view showing alignment with the other substrate.

FIG. 15 shows a method for facilitating the alignment of the inspection tray thus constructed with the inspection pack used for burn-in inspection. The alignment of the silicon substrate 1 with the inspection pack can be carried out by using the end surface 40 of the substrate 1 or a highly accurately machined through-hole 39 as a reference, and assembling with the other substrate can be facilitated.

In the inspection tray constructed in the forgoing manner, a plurality of electrode pads for electric conduction with the external unit can be freely disposed according to the size of the chip to be inspected. In other words, intervals among the plurality of electrode pads, or a the length of wiring from the probe to each electrode pad can be set freely. In addition, because the metallic wirings are the respective independent wirings, for example, these wirings should preferably be covered with insulating materials containing silicon oxide or the like.

The structure using the inspection tray according to the invention can be used not only for burn-in inspection but also for other inspection operations. Thus, the inspection time is shortened, thereby making it possible to reduce costs.

With regard to each of the structures of the invention discussed above, as well as the same number of the structures as that of the electrode pads of the chip to be inspected may be formed, for example, a larger number of the probes than that of the electrode pads of the chip to be inspected may be formed. Even when the probe can be no longer used because of its end of life in the inspection of wafer, as described above, the formation of a plurality of probes enables a new inspection tray to be provided only by changing the positions thereof.

The invention mentioned above was applied to the burn-in inspection device, and the result was obtained, that contact resistance between the electrode pad of the wafer to be inspected and the probe end terminal was low, i.e., 0.5Ω or lower, and a testing frequency obtained was 200 MHz or higher. Moreover, the life reached 300 thousand times or greater.

Furthermore, since the inspection of the electrode pad of the wafer to be inspected can be surely performed, the invention can be used for an LSI electrode, a micro-pattern drawing-out or a connector for connection.

The inspection tray according to the invention is advantageous in that since highly reliable silicon is used for the structure material, and the chip to be inspected can be positioned highly accurately, the probe can be surely brought into contact with the plurality of electrode pads of the chip to be inspected. Moreover, it is possible to provide a low-cost and highly reliable semiconductor device, which is highly suited for mass production, because it can be machined by using the micro-machining technology, and which enables semiconductor device inspection to be carried out at narrow pitches.

What is claimed is:

1. A method for manufacturing an inspection substrate of a semiconductor element for inspecting the semiconductor element by disposing a plurality of probes on a first silicon substrate, and then bringing a plurality of electrode pads of the semiconductor element into contact with the probes, said method comprising the steps of:
   forming a plurality of probe projections and a plurality of positioning projections on one surface of the first substrate;
   forming beams or diaphragms for the probes on the other surface of the first substrate; and
   forming wiring between an upside of each probe and each electrode pad provided on the first substrate.

2. The method for manufacturing the inspection substrate of the semiconductor element according to claim 1, further comprising the steps of: forming a positioning projection on a second substrate different from the first substrate; and joining the second substrate to the first substrate.

3. The method for manufacturing the inspection substrate of the semiconductor element according to claim 2, wherein the second substrate is made of silicon, and one of a projection and a groove for positioning the first and second substrates is formed.

4. The method for manufacturing the inspection substrate of the semiconductor element according to claim 3, wherein the projection or groove is formed by silicon anisotropic etching to have a (111) crystal surface.

5. The method for manufacturing the inspection substrate of the semiconductor element according to claim 2, wherein the first and second substrates of an inspection tray are joined to each other.

6. The method for manufacturing the inspection substrate of the semiconductor element according to claim 5, wherein for the second substrate, glass containing sodium or a shape memory alloy is used.

7. The method for manufacturing the inspection substrate of the semiconductor element according to claim 1, wherein the probe projections are spaced from the positioning projections.

8. The method for manufacturing the inspection substrate of the semiconductor element according to claim 1, wherein the plurality of positioning projections are integral with said first substrate.

9. The method for manufacturing the inspection substrate of the semiconductor element according to claim 8, wherein said positioning projections are formed simultaneously with said probe projections.

10. The method for manufacturing the inspection substrate of the semiconductor element according to claim 8, wherein said positioning projections and said probe projections extend substantially a same height above said one surface of the first substrate.

11. The method for manufacturing the inspection substrate of the semiconductor element according to claim 1, wherein the positioning projections include wiring grooves, and the wiring is formed in said wiring grooves.

12. The method for manufacturing the inspection substrate of the semiconductor element according to claim 11, wherein the wiring grooves are formed at the same time that the plurality of positioning grooves are formed.

13. The method for manufacturing the inspection substrate of the semiconductor element according to claim 2, wherein the second substrate extends to a height above the one surface of the first substrate which is at least as great as a height that the plurality of probe projections extend above the one surface of the first substrate.

14. The method for manufacturing the inspection substrate of the semiconductor element according to claim 2, wherein a first projection or groove for aligning the first and second substrates and a second projection or groove to suppress shifting between the first and second substrates are formed.

* * * * *